United States Patent
Jeon et al.

(10) Patent No.: US 9,104,526 B2
(45) Date of Patent: Aug. 11, 2015

(54) TRANSACTION SPLITTING APPARATUS AND METHOD

(75) Inventors: Young-Sun Jeon, Yongin-si (KR); Ho Jin Lee, Seoul (KR); Joon Hyuk Cha, Incheon (KR); Shi Hwa Lee, Seoul (KR); Young Su Moon, Cheonan-si (KR); Hyun Sang Park, Cheonan Si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 613 days.

(21) Appl. No.: 13/067,071

(22) Filed: May 5, 2011

(65) Prior Publication Data

US 2011/0283042 A1     Nov. 17, 2011

(30) Foreign Application Priority Data

May 11, 2010   (KR) ........................ 10-2010-0043899

(51) Int. Cl.
*G06F 12/00* (2006.01)
*G06F 12/06* (2006.01)
*G06F 13/00* (2006.01)
*G06F 15/00* (2006.01)
*G11C 7/10* (2006.01)

(52) U.S. Cl.
CPC ................ *G06F 13/00* (2013.01); *G06F 15/00* (2013.01); *G11C 7/1042* (2013.01)

(58) Field of Classification Search
CPC .................................. G06F 13/00; G06F 15/00
USPC ............................................................ 711/5
See application file for complete search history.

(56) References Cited

U.S. PATENT DOCUMENTS

| | | | | |
|---|---|---|---|---|
| 3,796,996 | A | * | 3/1974 | Curley et al. ................. 711/157 |
| 3,820,079 | A | * | 6/1974 | Bergh et al. .................. 710/112 |
| 4,513,372 | A | * | 4/1985 | Ziegler et al. ..................... 711/5 |
| 5,745,913 | A | * | 4/1998 | Pattin et al. .................... 711/105 |
| 6,049,855 | A | * | 4/2000 | Jeddeloh ....................... 711/157 |
| 6,442,088 | B1 | * | 8/2002 | Tsuchida et al. .............. 365/203 |

(Continued)

FOREIGN PATENT DOCUMENTS

| | | | |
|---|---|---|---|
| JP | 10-144073 | 5/1998 | |
| JP | 10144073 A | * 5/1998 | .......... G11C 11/407 |

(Continued)

OTHER PUBLICATIONS definition of "natural number", American Heritage Dictionary of the English Language, retrieved from http://www.thefreedictionary.com/natural+number on Jul. 17, 2013 (1 page).*

(Continued)

*Primary Examiner* — Sanjiv Shah
*Assistant Examiner* — Daniel C Chappell
(74) *Attorney, Agent, or Firm* — Staas & Halsey LLP (57) ABSTRACT

A transaction splitting apparatus and method are provided in which neighboring sub-transactions accessing a predetermined bank in each memory may access different banks. The transaction splitting apparatus includes a first processing unit to split a transaction into at least one sub-transaction, the transaction accessing a first bank among a plurality of banks comprised in a memory, and a second processing unit to translate an address of the at least one sub-transaction, to interleave the at least one sub-transaction using the plurality of banks.

18 Claims, 6 Drawing Sheets

(56) References Cited

U.S. PATENT DOCUMENTS

| | | | |
|---|---|---|---|
| 6,662,331 B1* | 12/2003 | Kang | 714/755 |
| 6,665,768 B1* | 12/2003 | Redford | 711/5 |
| 6,678,204 B2* | 1/2004 | Nagashima et al. | 365/189.14 |
| 6,862,244 B2* | 3/2005 | Lee | 365/230.03 |
| 7,221,612 B2* | 5/2007 | Van De Waerdt | 365/230.03 |
| 7,996,601 B2* | 8/2011 | Yang et al. | 711/105 |
| 8,578,134 B1* | 11/2013 | Jarosh et al. | 712/204 |
| 2002/0069282 A1* | 6/2002 | Reisman | 709/227 |
| 2003/0112694 A1* | 6/2003 | Lee | 365/230.03 |
| 2003/0123318 A1* | 7/2003 | Nagashima et al. | 365/233 |
| 2005/0060482 A1* | 3/2005 | Ishikawa | 711/5 |
| 2006/0047890 A1* | 3/2006 | Van De Waerdt | 711/105 |
| 2006/0117155 A1* | 6/2006 | Ware et al. | 711/163 |
| 2006/0245265 A1* | 11/2006 | Jeong | 365/189.01 |
| 2007/0186067 A1* | 8/2007 | Nagata et al. | 711/162 |
| 2007/0250677 A1* | 10/2007 | Ware et al. | 711/167 |
| 2008/0126691 A1* | 5/2008 | Yang et al. | 711/105 |
| 2008/0192559 A1* | 8/2008 | Bains | 365/230.03 |

FOREIGN PATENT DOCUMENTS

| | | |
|---|---|---|
| KR | 10-1999-0088093 | 12/1999 |
| KR | 10-2003-0049893 | 6/2003 |
| KR | 10-2005-0027923 | 3/2005 |
| KR | 10-2005-0085056 | 8/2005 |
| KR | 10-2006-0113019 | 11/2006 |
| KR | 10-2007-0086686 | 8/2007 |
| KR | 10-2008-0047907 | 5/2008 |
| KR | 10-2009-0060237 | 6/2009 |

OTHER PUBLICATIONS 3.3.1 Interleaved Memory, verena@csep1.phy.ornl.gov, Apr. 23, 2008, retrieved from http://web.archive.org/web/20080423182854/http://www.phy.ornl.gov/csep/ca/node19.html on Jul. 17, 2013 (1 page).* definition of "switch", Merriam-Webster Dictionary, retrieved from http://www.merriam-webster.com/dictionary/switched on Jul. 14, 2013 (1 page).*

Linux System Programming By: Robert Love Publisher: O'Reilly Media, Inc. Pub. Date: Sep. 18, 2007 Most Recent Edition Print ISBN-13: 978-0-596-00958-8 Print ISBN-10: 0-596-00958-5 Pages In Print Edition: 400.*

How RAM Works, Tyson et al, May 2, 2009, retrieved from https://web.archive.org/web/20090502235006/http://computer.howstuffworks.com/ram3.htm on Dec. 30, 2013 (3 pages).*

Everything You Always Wanted to Know About SDRAM (Memory): But Were Afraid to Ask, Rajinder Gill, Aug. 15, 2010, retrieved from http://www.anandtech.com/show/3851/everything-you-always-wanted-to-know-about-sdram-memory-but-were-afraid-to-ask/3 on Dec. 30, 2013 (11 pages).*

\* cited by examiner

TRANSACTION SPLITTING APPARATUS AND METHOD

CROSS-REFERENCE TO RELATED APPLICATIONS

This application claims the priority benefit of Korean Patent Application No. 10-2010-0043899, filed on May 11, 2010, in the Korean Intellectual Property Office, the disclosure of which is incorporated herein by reference.

BACKGROUND

1. Field

One or more embodiments of the following description relate to transaction processing on a System-on-Chip (SoC) platform, and more particularly, to a method and apparatus that may improve a memory transmission efficiency on a SoC platform including an Image Signal Processor (ISP).

2. Description of the Related Art

To sequentially apply a precharge command and an active command, when a Synchronous Dynamic Random Access Memory (SDRAM) is accessed, a latency of several clock cycles may occur The SDRAM has a plurality of banks, namely, independent memory cores. The plurality of banks may share a control signal and a data signal. There is no delay between applying a precharge command to one bank and applying an active command to another bank. In other words, a delay occurring when accessing the SDRAM may be minimized by interleaving the plurality of banks.

However, since a transaction for processing a High Definition (HD) image has a large size, a memory bank interleaving of a transaction unit has limitations in reducing latency.

Additionally, to maximize an effect of bank interleaving, different banks may be targeted by memory accesses that are sequentially adjacent to each other, which may not be possible on a system.

SUMMARY

The foregoing and/or other aspects are achieved by providing a transaction splitting apparatus, including: a processor to control one or more processor-executable units, a first processing unit to split a transaction into at least one sub-transaction, the transaction accessing a first bank among a plurality of banks comprised in a memory, and a second processing unit to translate an address of the at least one sub-transaction, to interleave the at least one sub-transaction using the plurality of banks.

A first sub-transaction among the at least one sub-transaction may be processed by accessing the first bank, and a second sub-transaction among the at least one sub-transaction may be processed by a second bank among the plurality of banks.

An active operation of the second bank for processing the second sub-transaction may be performed while the first sub-transaction is processed by accessing the first bank.

The transaction splitting apparatus may further include a third processing unit to buffer the at least one sub-transaction of which the address is translated. When transaction is a write transaction, and when the third processing unit completes buffering of the at least one sub-transaction, the third processing unit may output a complete signal of the transaction.

The first processing unit may split, into at least one sub-transaction, commands that are scheduled to be switched in the transaction and are associated with addresses of which higher-order bits are the same.

When the at least one sub-transaction has a maximum burst length of $2^L$, and when a system has a data width of $2^W$ bytes, wherein L and W are natural numbers, the first processing unit may split, into the at least one sub-transaction, commands that are associated with addresses of which a most significant bit (MSB) through an (L+W+1)-th bit from a Least Significant Bit (LSB) are the same.

When a number of the plurality of banks is $2^B$, when each of the plurality of banks has a size of $2^N$ bytes, when the at least one sub-transaction has a maximum burst length of $2^L$, and when a system has a data width of $2^W$ bytes, wherein B, N, L and W are natural numbers, the second processing unit may shift a (B+W+L)-th bit through a (W+L+1)-th bit from an LSB to an (N+B)-th bit through an (N+1)-th bit from the LSB, and may shift the (N+B)-th bit through a (B+W+L+1)-th bit from the LSB to an N-th bit through the (W+L+1)-th bit from the LSB, to translate the address of the at least one sub-transaction.

The foregoing and/or other aspects are achieved by providing a transaction splitting method, including: splitting, by a first processing unit of a transaction splitting apparatus having a processor, a transaction into at least one sub-transaction, the transaction accessing a first bank among a plurality of banks comprised in a memory, and translating, by a second processing unit of the transaction splitting apparatus, an address of the at least one sub-transaction, to interleave the at least one sub-transaction using the plurality of banks.

Additional aspects, features, and/or advantages of embodiments will be set forth in part in the description which follows and, in part, will be apparent from the description, or may be learned by practice of the disclosure.

The foregoing and/or other aspects are achieved by providing a transaction splitting apparatus, including: a first processing unit to split a transaction into at least one sub-transaction, the transaction accessing a first bank among a plurality of banks comprised in a memory; and a second processing unit to translate an address of the at least one sub-transaction, to interleave the at least one sub-transaction using the plurality of banks.

A first sub-transaction among the at least one sub-transaction may be processed by accessing the first bank, and a second sub-transaction among the at least one sub-transaction may be processed by a second bank among the plurality of banks.

An active operation of the second bank for processing the second sub-transaction may be performed while the first sub-transaction is processed by accessing the first bank.

The transaction splitting apparatus may further include a third processing unit to buffer the at least one sub-transaction of which the address is translated. When transaction is a write transaction, and when the third processing unit completes buffering of the at least one sub-transaction, the third processing unit may output a complete signal of the transaction.

The first processing unit may split, into at least one sub-transaction, commands that are scheduled to be switched in the transaction and are associated with addresses of which higher-order bits are the same.

When the at least one sub-transaction has a maximum burst length of $2^L$, and when a system has a data width of $2^W$ bytes, wherein L and W are natural numbers, the first processing unit may split, into the at least one sub-transaction, commands that are associated with addresses of which a most significant bit (MSB) through an (L+W+1)-th bit from a Least Significant Bit (LSB) are the same.

When a number of the plurality of banks is $2^B$, when each of the plurality of banks has a size of $2^N$ bytes, when the at least one sub-transaction has a maximum burst length of $2^L$, and when a system has a data width of $2^W$ bytes, wherein B, N, L and W are natural numbers, the second processing unit may shift a (B+W+L)-th bit through a (W+L+1)-th bit from an LSB to an (N+B)-th bit through an (N+1)-th bit from the LSB, and may shift the (N+B)-th bit through a (B+W+L+1)-th bit from the LSB to an N-th bit through the (W+L+1)-th bit from the LSB, to translate the address of the at least one sub-transaction.

The foregoing and/or other aspects are achieved by providing a transaction splitting method, including: splitting, by a first processing unit of a transaction splitting apparatus, a transaction into at least one sub-transaction, the transaction accessing a first bank among a plurality of banks comprised in a memory; and translating, by a second processing unit of the transaction splitting apparatus, an address of the at least one sub-transaction, to interleave the at least one sub-transaction using the plurality of banks.

Additional aspects, features, and/or advantages of embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. Embodiments are described below to explain the present disclosure by referring to the figures.

Figure 1:
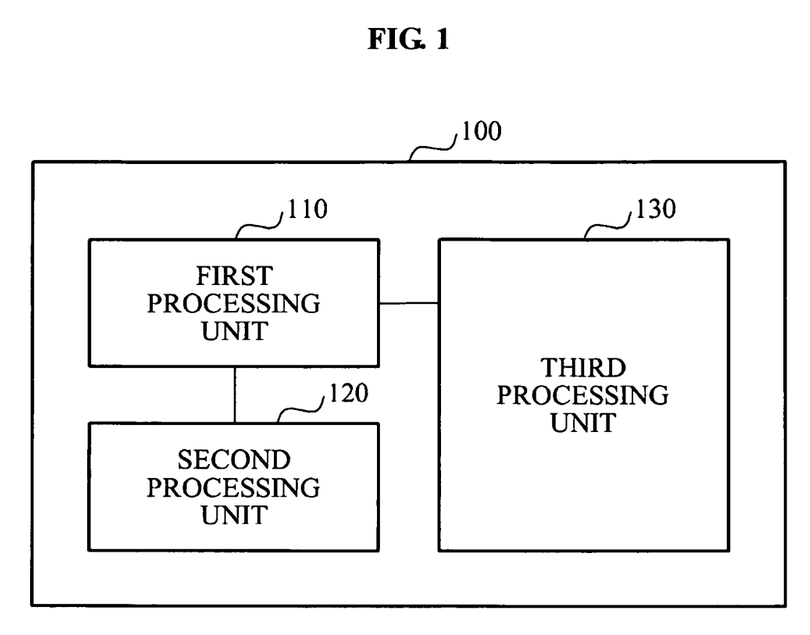
FIG. 1 illustrates a configuration of a transaction splitting apparatus according to one or more embodiments.

FIG. 1 illustrates a configuration of a transaction splitting apparatus 100 according to one or more embodiments. The transaction splitting apparatus 100 may include a first processing unit 110 for performing a transaction split, and a second processing unit 120 for performing an address translation. The transaction splitting apparatus 100 may further include a third processing unit 130 for performing buffering.

The transaction splitting apparatus 100 may split a received memory burst transaction into at least one sub-transaction, and may transmit the at least one sub-transaction. Here, the burst transaction may include transmitting, by a master of a bus, a single address to a slave of the bus, and continuously reading or writing, by the slave receiving the address, serial data included in the address and consecutive addresses from the received address.

The burst transaction may include a single address cycle and at least one data cycle. The burst transaction may be terminated when the master completes transmission of data or when the slave is no longer able to process burst transmission.

The transaction splitting apparatus 100 may perform the splitting so that the at least one sub-transaction may be interleaved by accessing different banks.

The transaction and the at least one sub-transaction may comply with an Advanced eXtensible Interface (AXI) protocol. Here, an input of the transaction splitting apparatus 100 may be performed via a standard AXI slave port, and an output of the transaction splitting apparatus 100 may be performed via a standard AXI master port.

Hereinafter, the first processing unit 110, the second processing unit 120, and the third processing unit 130 that are included in the transaction splitting apparatus 100 will be further described. In the following description, each bank may have a size of $2_N$ bytes, a number of banks may be $2^B$, a system may have a data width of $2^W$ bytes, and a burst may have a length of $2^L$. Here, N, B, W, and L are natural numbers.

The first processing unit 110 may split, into at least one sub-transaction, an input transaction that accesses a bank among a plurality of banks included in a memory. The splitting operation may be performed based on higher-order bits obtained by excluding lower W+L bits from a data address in the input transaction, that is, based on a Most Significant Bit (MSB) through an (L+W+1)-th bit from a Least Significant Bit (LSB).

Data in addresses of which the higher-order bits are the same may be accessed by one sub-transaction. When the higher-order bits of the data address in consecutive data are changed, a switching operation may be expected to be performed in the second processing unit 120 that is described below. The switching operation may enable a bank including a previous data address to be changed in a different manner from a bank including a current data address while translating addresses of data in sub-transactions.

When an input transaction starts at an address 'A', and when data of $2^W$ bytes is transmitted 'BL' times (here, BL is a natural number), a number of sub-transactions into which the input transaction is split may be computed by the following Equation 1:

$$S = \left\lfloor \frac{(A - ((A >> (W+L)) << (W+L))) + BL \cdot 2^W}{2^{W+L}} \right\rfloor. \quad \text{[Equation 1]}$$

In Equation 1, $\lfloor x \rfloor$ denotes a smallest integer among integers that are equal to or greater than x.

Shifting on the address 'A' may be performed to extract only higher-order bits of the address 'A', and lower-order bits of the address 'A' may be extracted from a difference between the address 'A' and the higher-order bits of the address 'A'.

Equation 1 may be used to compute a start address and a burst length of each sub-transaction.

The start address and the burst length of each sub-transaction may be examined.

First, a start address '$A_1$' of a first sub-transaction among S sub-transactions may be the address 'A,' and a burst length '$BL_1$' of the first sub-transaction may be computed by the following Equation 2:

$$BL_1 = 2^L - (A - ((A >> (W+L)) << (W+L))) \quad \text{[Equation 2]}$$

Subsequently, among the S sub-transactions, a start address '$A_n$' of an N-th sub-transaction (1<N<S) may be computed by the following Equation 3, and a burst length 'BL$_n$' of the N-th sub-transaction may be computed as $2^L$:

$$A_n=((A>>(W+L))<<(W+L))+(n-1)\cdot 2^{(W+L)} \quad \text{[Equation 3]}$$

Additionally, a start address 'S$_n$' of the S-th sub-transaction among the S sub-transactions may be computed by the following Equation 4, and a burst length 'BL$_s$' of the S-th sub-transaction may be computed by the following Equation 5:

$$A_S=((A>>(W+L))<<(W+L))+(s-1)\cdot 2^{(W+L)} \quad \text{[Equation 4]}$$

$$A_S=(BL\cdot 2^w-(2^L-(A-((A>>(W+L))<<(W+L))))) \% 2^L \quad \text{[Equation 5]}$$

The second processing unit 120 may translate an address of the at least one sub-transaction to interleave the at least one sub-transaction using the plurality of banks. In other words, the second processing unit 120 may translate the address of the at least one sub-transaction, so that the at least one sub-transaction (e.g., the N-th sub-transaction) and a preceding sub-transaction (e.g., an (N−1)-th sub-transaction) may use different banks.

For example, when a first sub-transaction among the at least one sub-transaction is processed by accessing a first bank among the plurality of banks, a second sub-transaction among the at least one sub-transaction may be processed by a second bank among the plurality of banks. Accordingly, an active operation of the second bank for processing the second sub-transaction may be performed when the first sub-transaction is being processed by accessing the first bank.

Figure 2:
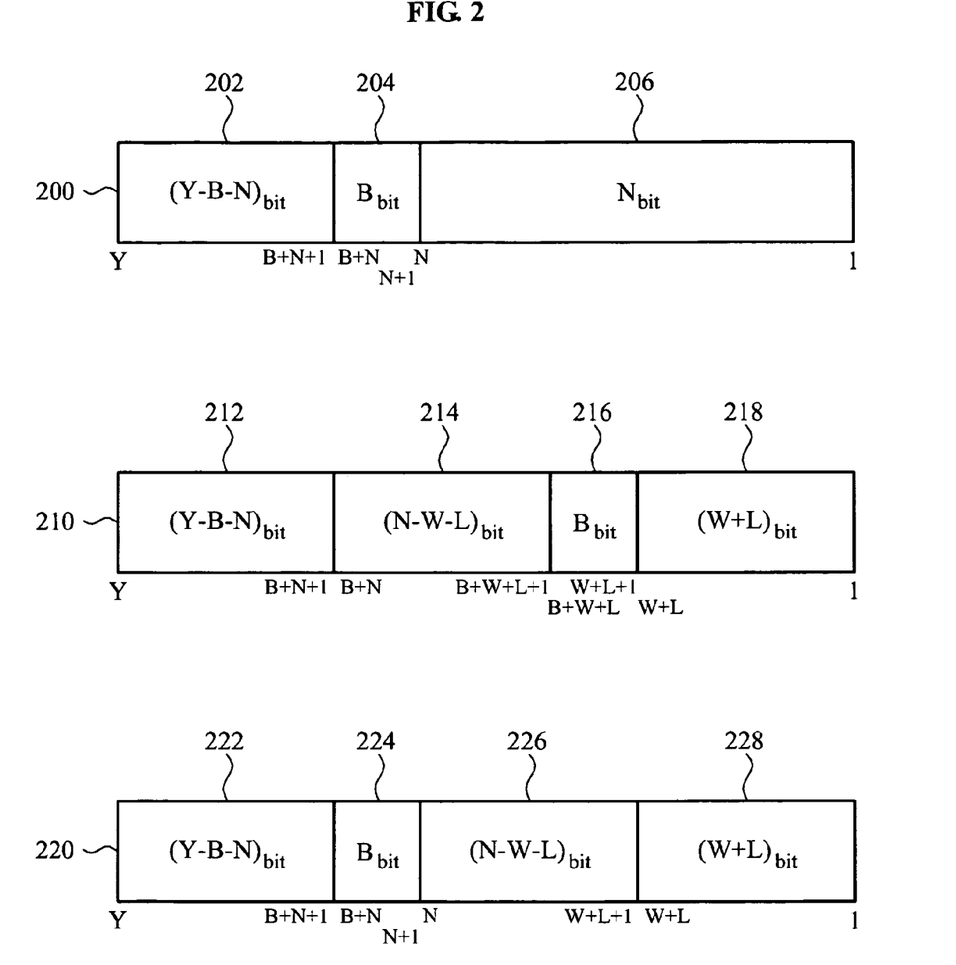
FIG. 2 illustrates an example where a second processing unit translates an address of a sub-transaction.

FIG. 2 illustrates an example where the second processing unit 120 translates an address of a sub-transaction.

FIG. 2 illustrates examples of a system address 200, an un-translated address 210, and a translated address 220, with respect to a Y-bit address system where Y bits are used for address designation.

In the system address 200, each bank having a size of $2^N$ bytes may occupy N bits. Accordingly, an N$_{bit}$ 206 including an N-th bit from an LSB through the LSB may be used to set a row address. Additionally, since $2^B$ banks exist, a B$_{bit}$ 204 including a (B+N)-th bit through an (N+1)-th bit from the LSB may be used to set a bank, namely, a column address.

Accordingly, an address translation may be performed so that a data address in a single sub-transaction may indicate the same bank, and that neighboring sub-transactions may use different banks.

The un-translated address 210 may be split into four sections 212, 214, 216, and 218 that respectively occupy (Y-B-N) bits, (N-W-L) bits, B bits, and (W+L) bits. The first section 212 including an MSB through an (B+N+1)-th bit from an LSB may have no relevance to setting of row and column addresses. In other words, the first section 212 may be excluded from the address translation.

The second section 214 including a (B+N)-th bit through a (B+W+L+1)-th bit from the LSB, and the third section 216 including a (B+W+L)-th bit through a (W+L+1)-th bit from the LSB may indicate the same data address in a single sub-transaction.

The transaction splitting apparatus 100 may split, into one sub-transaction, the data addresses of which the second section 214 and the third section 216 are same from among all data addresses in a transaction.

In the fourth section 218 including a (W+L)-th bit through the LSB, data addresses in a single sub-transaction may differ from each other. The fourth section 218 may be excluded from the address translation.

The translated address 220 may be split into four sections 222, 224, 226, and 228 that respectively occupy (Y-B-N) bits, B bits, (N-W-L) bits, and (W+L) bits.

The first section 222 including an MSB through an (B+N+1)-th bit from an LSB may be identical to the first section 212 of the un-translated address 210. Additionally, the fourth section 228 including a (W+L)-th bit through the LSB may be identical to the fourth section 218 of the un-translated address 210.

The second section 224 including a (B+N)-th bit through an (N+1)-th bit from the LSB may be identical to the third section 216 of the un-translated address 210. The third section 226 including an N-th bit through a (W+L+1)-th bit from the LSB may be identical to the second section 214 of the un-translated address 210. In other words, the third section 216 and the second section 214 of the un-translated address 210 may be shifted to the second section 224 and the third section 226, respectively, of the translated address 220.

Consecutive sub-transactions may have different values in the third section 216 of the un-translated address 210, and the third section 216 may be shifted to the second section 224 of the translated address 220 that indicates a bank. Accordingly, a sub-transaction and a preceding sub-transaction may use different banks.

The third processing unit 130 may be further included in the transaction splitting apparatus 100 to effectively execute a write command. The third processing unit 130 may receive the transaction, may buffer the received transaction, and may transmit the buffered transaction to the first processing unit 110. When the transaction is a write transaction, the third processing unit 130 may complete the buffering of the transaction, and may output a complete signal of the transaction.

Figure 3:
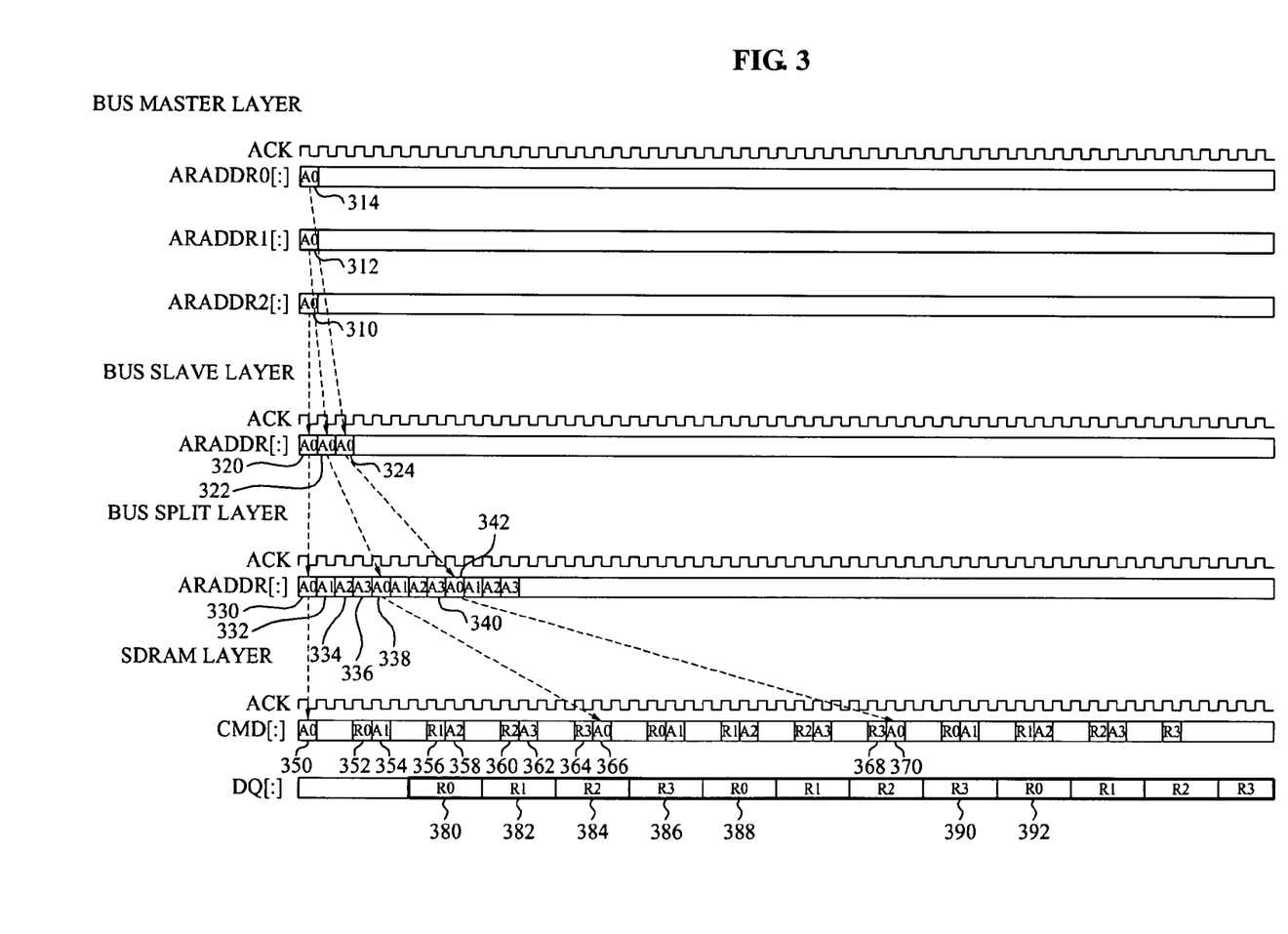
FIG. 3 illustrates a signal diagram of an example of processing a transaction according to one or more embodiments.

FIG. 3 illustrates a signal diagram of an example of processing a transaction according to one or more embodiments.

FIG. 3 illustrates signals on a bus master layer, a bus slave layer, a bus split layer, and a Synchronous Dynamic Random Access Memory (SDRAM) layer, when three bus masters access data of the same bank through a transaction.

Specifically, FIG. 3 illustrates read address signals ARADDR2[:], ARADDR1[:], and ARADDR0[:] of masters 2, 1, and 0, and an acknowledge clock (ACK) for the read address signals ARADDR2[:], ARADDR1[:], and ARADDR0[:] on the bus master layer. FIG. 3 also illustrates a read address signal ADADDR[:] and an ACK for the read address signal ADADDR[:] on the bus slave layer, and illustrates a read address signal ADADDR[:] and an ACK for the read address signal ADADDR[:] on the bus split layer. Additionally, a command (CMD) signal and a data (DQ) signal on an SDRAM layer, and an ACK for the CMD and DQ are shown in FIG. 3.

In the read address signals on the bus master layer, 'A0's 310, 312, and 314 may represent transaction commands using a bank '0'. When the transaction commands 310, 312, and 314 are transmitted to a lower layer, read data corresponding to the transaction commands may be transmitted to the bus master layer.

Signals on the bus master layer may be transferred to the bus slave layer by passing through a bus matrix.

'A0's 320, 322, and 324 in the read address signal on the bus slave layer may respectively correspond to the 'A0's 310, 312, and 314 on the bus master layer. When transaction commands 320, 322, and 324 are transmitted to a lower layer, read data corresponding to the transaction commands may be transmitted to the bus slave layer.

The transaction splitting apparatus 100 performing a task of the bus split layer may split the transaction commands 320, 322, and 324 in the bus slave layer into consecutive sub-transactions, and may transmit the consecutive sub-transactions to the SDRAM layer. When the transaction splitting apparatus 100 is located in an SDRAM controller, the signal on the bus split layer may be a signal in the SDRAM controller.

First four sub-transactions 330, 332, 334, and 336 in the read address signal on the bus split layer may be obtained by splitting a first transaction 320 in the bus slave layer. Specifically, the first processing unit 110 of FIG. 1 may split the first transaction 320 into at least one sub-transaction, for example, the four sub-transactions 330, 332, 334, and 336 of FIG. 3.

Here, since addresses of the sub-transactions 330, 332, 334, and 336 are not yet translated, all of the sub-transactions 330, 332, 334, and 336 may have the same address to the first transaction 320 in a higher layer. In other words, the sub-transactions 330, 332, 334, and 336 may have an address indicating a bank '0'.

The second processing unit 120 may translate the addresses of the sub-transactions 330, 332, 334, and 336. In the same manner as described above, the sub-transactions 330, 332, 334, and 336 may respectively have addresses that respectively indicate a bank '0', a bank '1', a bank '2' and a bank '3'.

Second four sub-transactions in the read address signal on the bus split layer may be obtained by splitting a second transaction 322 in the bus slave layer. Last four sub-transactions in the read address signal on the bus split layer may be obtained by splitting a third transaction 324 in the bus slave layer.

The splitting operation has been described above. Here, a sub-transaction and a preceding sub-transaction may use different banks, and that neighboring sub-transactions, for example, sub-transactions 336 and 338, or sub-transactions 340 and 342, into which different transactions are split may also use different banks.

The sub-transactions in the bus split layer may be transmitted from the transaction splitting apparatus 100 to the SDRAM layer.

A first 'A' 350 and a first 'R' 352 in the CMD signal on the SDRAM layer may correspond to the first sub-transaction 'A0' 330 in the read address signal on the bus split layer. Additionally, an n-th 'A' and an n-th 'R' in the CMD signal on the SDRAM layer may correspond to an n-th sub-transaction in the read address signal on the bus split layer.

In the CMD signal, 'A', and 'R' may respectively correspond to an active command, and a read command. Additionally, 'R' may also correspond to a precharge command, since the 'R' and 'A' adjacent to the 'R' use different banks.

When a precharge command is applied to a bank, a latency of several clock cycles may be incurred until an active command is applied to the bank.

However, since the transaction splitting apparatus 100 enables neighboring sub-transactions to use different banks of a memory as described above, a sufficient interval may exist between a precharge command for a bank (e.g., a first precharge command 352 for the bank '0') and a next active command for the bank (e.g., a next active command 366 for the bank '0').

Additionally, no delay may occur between a precharge command for a bank and an active command for another bank, for example between the first precharge command 352 for the bank '0' and an active command 354 for the bank '1'.

Accordingly, each of the sub-transactions may be sequentially performed without delay. The non-delayed execution of the sub-transactions as described above may also be applied between 'R's 352, 356, and 360 and 'A's 354, 358, and 362 that correspond to the first transaction 320 on the bus slave layer.

Additionally, the non-delayed execution may also be applied between 'R's 364 and 368 of a last sub-transaction of a transaction and 'A's 366 and 370 of a first sub-transaction of a next transaction.

Read data based on the command may be output through the DQ signal after several clocks cycles. In other words, read data 'R0' 380 corresponding to the first 'A' 350 and the first 'R' 352 may be transmitted through the DQ signal. Here, the read data 'R0' may refer to data using the bank '0'.

First four pieces of read data 380, 382, 384, and 386 may be read data signals respectively corresponding to four 'A's 350, 354, 358, and 362 and four 'R's 352, 356, 360, and 364 in the CMD signal. The first four pieces of read data may be read by different banks.

Accordingly, while performing data read commands, a latency may not occur. Additionally, a delay may not occur between the read data (e.g., 'R' 386 and 'R' 388, or 'R' 390 and 'R' 392) when a transaction is changed.

The read data may be transmitted to the bus split layer, the bus slave layer, and the bus master layer, in sequence, without delay.

For example, when the splitting operation and the address translation operation are not performed by the transaction splitting apparatus 100, the bank '0' may be targeted by all accesses in the SDRAM layer.

In four sub-transactions corresponding to a single transaction, the 'A's 354, 358, and 362, excluding the first 'A' 350, may indicate consecutive addresses in the same bank and thus, the 'A's 354, 358, and 362 may not be signaled.

Additionally, since the same bank is continuously used in the 'R's 352, 356, and 360, excluding the last 'R' 364, the precharge command may not be executed. Accordingly, the read data 380, 382, 384, and 386 based on the four sub-transactions may be transmitted continuously without delay.

However, a delay may occur between a precharge command executed in the last 'R' 364 and an active command executed in the 'A' 366 of a next sub-transaction. Accordingly, a delay may also occur between read data 386 corresponding to the last 'R' 364 and next read data 388. Also, another delay may occur between read data 390 and 392 at a boundary of a transaction.

Figure 4:
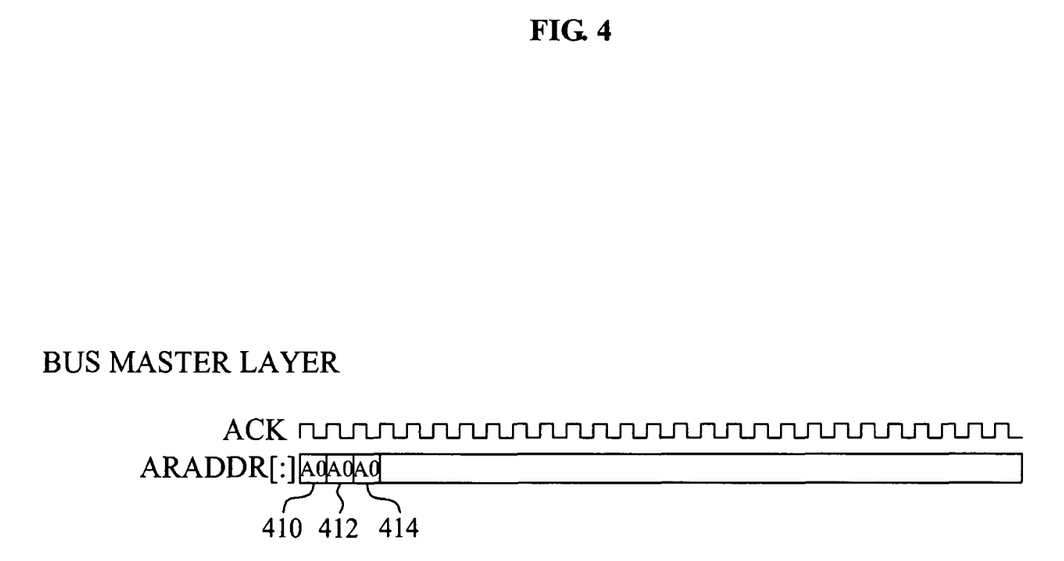
FIG. 4 illustrates a signal diagram of another example of processing a transaction according to one or more embodiments.

FIG. 4 illustrates a signal diagram of another example of processing a transaction according to one or more embodiments.

As shown in FIG. 4, on a bus master layer, a single master may access data of the same bank through a long transaction. In the embodiment described with reference to FIG. 3, the three masters simultaneously transmit the transaction commands 310, 312, and 314, whereas in the present embodiment of FIG. 4, a single master may transmit transaction commands 410, 412, and 414 in sequence based on a clock signal.

Signals in the bus master layer of FIG. 4 may be transferred through processing in a bus slave layer, a bus split layer, and a bus SDRAM layer in sequence. The processing in the slave layer, the bus split layer, and the bus SDRAM layer has been described above with reference to FIG. 3 and accordingly, further descriptions thereof will be omitted herein.

As a result, read data (not shown) corresponding to the transaction commands 410, 412, and 414 may be transmitted without delay between transactions, even when a signal master transmits the transaction commands 410, 412, and 414.

Figure 5:
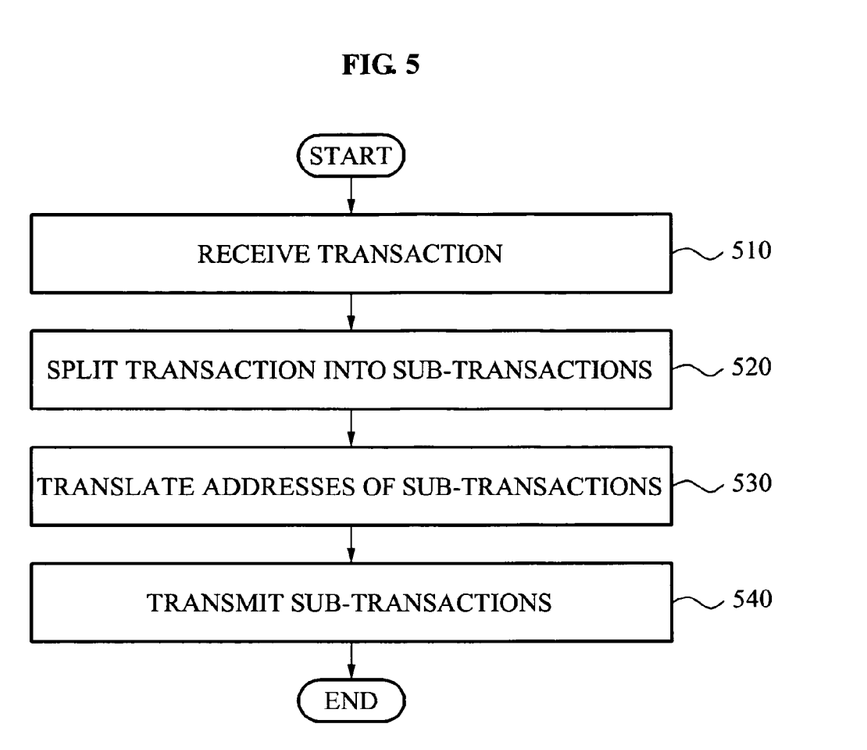
FIG. 5 illustrates a transaction splitting method according to embodiments.

FIG. 5 illustrates a transaction splitting method according to one or more embodiments.

In operation 510, a transaction may be received from a higher layer, for example, a slave layer.

In operation 520, the received transaction may be split into sub-transactions. Operation 520 may be performed as described above with reference to FIGS. 1 through 4.

When the transaction is split into the sub-transactions, addresses of the sub-transactions may be translated in operation 530. Operation 530 may be performed as described above with reference to FIGS. 1 through 4.

In operation 540, the sub-transactions of which the addresses are translated may be transmitted to a lower layer.

Figure 6:
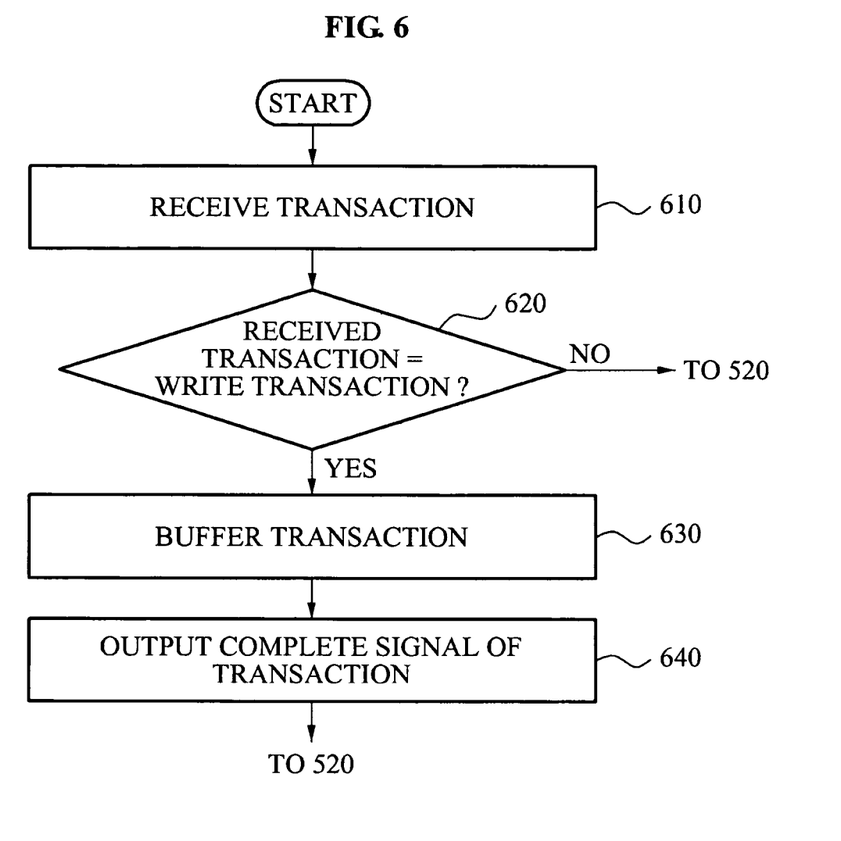
FIG. 6 illustrates a transaction buffering method according to one or more embodiments.

FIG. 6 illustrates a transaction buffering method according to one or more embodiments.

In operation 610, a transaction may be received from a higher layer, for example, a slave layer.

In operation 620, whether the received transaction is a write transaction may be determined. When the received transaction is determined to be the write transaction, operation 630 may be performed. Conversely, when the received transaction is determined not to be the write transaction, operation 520 of FIG. 5 may be performed as described above, since there is no need to buffer for the transaction determined not to be a write transaction. Operations subsequent to operation 520 may be performed as described above with reference to FIG. 5.

In operation 630, the transaction may be buffered.

When the buffering has been completed, a complete signal of the transaction may be transmitted, for example, to the higher layer in operation 640. Accordingly, there is no delay caused by the write transaction, so the higher layer may perform other tasks without delay.

After the complete signal of the transaction is transmitted, operation 520 of FIG. 5 may be performed. Operations subsequent to operation 520 may be performed as described above with reference to FIG. 5.

As described above, a transaction splitting apparatus according to one or more embodiments may be inserted between an SDRAM controller and a system bus such as a bus slave, without changing a memory map or structure of a conventional system. Additionally, the transaction splitting apparatus may be built into the SDRAM controller. As a result, it is possible to obtain an effect of substantially extending a memory bandwidth merely by inserting the transaction splitting apparatus into the conventional system.

Furthermore, the transaction splitting apparatus may be designed based on a standardized bus protocol, for example an Advanced Microcontroller Bus Architecture (AMBA) AXI protocol. Accordingly, the transaction splitting apparatus may be easily applied to a conventional System-on-Chip (SoC) platform using a plug-and-play scheme.

A multimedia SoC platform often processes an Ultra High Definition (UHD) image of at least 10 mega pixels (MP). To process the UHD image, the SoC platform may include, as a master, a module for large scale image data, for example an Image Signal Processor (ISP), a video codec, or a three-dimensional (3D) graphic accelerator.

The ISP may perform an image signal processing function, for example, a bad pixel replacement function, an RGB interpolation function, a noise reduction function, or an edge enhancement function.

Here, the master may perform a long burst transaction several times with respect to the same bank. Accordingly, in the SoC platform, a long burst transaction with a large size may occur. Here, the long burst transaction may use the same bank for a maximum burst length allowed in a system bus, for example 16 MP in an AMBA bus standard.

When the ISP uses a system memory to transmit an image to the video codec, a significantly greater number of long burst transactions for the same bank may occur.

Additionally, during 3D image processing based on time, when the ISP is not operated to simultaneously access two different SDRAM banks even when an image at a current point in time and an image at a previous point in time are respectively stored in the two different SDRAM banks, an optimal performance may not be reached.

When the 3D image processing is performed in a software manner, read and write operations may be sequentially generated and accordingly, availability of bank interleaving as described above may be further reduced.

Additionally, when the ISP is implemented in hardware or software, when the SoC system does not guarantee a huge bandwidth for 3D image processing, the ISP may not be operated normally.

Accordingly, a transaction splitting apparatus and method according to one or more embodiments may split a single transaction into sub-transactions that use different banks and thus, it is possible to increase a performance on a SoC platform where an ISP and the like are used.

Furthermore, in a predetermined bus structure, for example, an AMBA standard, a memory access may be set not to exceed a boundary of 1 kilobyte (KB) for an AMBA High-performance Bus (AHB) standard, or 4 KB for an AXI standard.

Accordingly, a memory may be arranged in 4 KB units so that bank interleaving may be performed. In other words, in a conventional memory configuration, a boundary of a bank may be changed after accesses in several MB units. However, in the currently described embodiments, a boundary of a bank may be changed in 4 KB units and thus, bank interleaving may be more efficiently performed using the transaction splitting apparatus and method according to one or more embodiments.

The methods according to the above-described embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts.

Examples of non-transitory computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter.

The described hardware devices may be configured to act as one or more software modules in order to perform the operations of the above-described embodiments, or vice versa. The one or more transaction splitting methods described herein may be executed on a general purpose computer or processor or may be executed on a particular machine such as the one or more transaction splitting apparatuses described herein.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A transaction splitting apparatus, comprising:
a hardware processor to control one or more processor-executable units:
a first processing unit to split a transaction into at least one sub-transaction, the transaction accessing a first bank among a plurality of banks comprised in a memory; and
a second processing unit to translate an address of the at least one sub-transaction to interleave the at least one sub-transaction by accessing different banks of the plurality of banks,
wherein the at least one sub-transaction accesses the different banks of the plurality of banks consecutively, and
wherein the first processing unit splits, into the at least one sub-transaction, commands that are associated with addresses of which a most significant bit (MSB) through an (L plus W plus 1)-th bit from a least significant bit (LSB) are the same, when the at least one sub-transaction has a maximum burst length of $2^L$, and when a system has a data width of $2^W$ bytes, wherein L and W are natural numbers.

2. The transaction splitting apparatus of claim 1, wherein a first sub-transaction among the at least one sub-transaction is processed by accessing the first bank, and a second sub-transaction among the at least one sub-transaction is processed by a second bank among the plurality of banks.

3. The transaction splitting apparatus of claim 1,
wherein the at least one sub-transaction respectively have the translated address that respectively indicate the plurality of banks, and
wherein no delay occurs between a read/precharge command for one of the plurality of banks and an active command for another of the plurality of banks.

4. The transaction splitting apparatus of claim 2, wherein an active operation of the second bank for processing the second sub-transaction is performed while the first sub-transaction is processed by accessing the first bank.

5. The transaction splitting apparatus of claim 1, further comprising:
a third processing unit to buffer the at least one sub-transaction for which the address is translated,
wherein the third processing unit outputs a complete signal of the transaction when the transaction is a write transaction and when the third processing unit completes buffering of the at least one sub-transaction.

6. The transaction splitting apparatus of claim 1, wherein the first processing unit splits, into at least one sub-transaction, commands that are scheduled to be exchanged in the transaction and are associated with addresses of which higher-order bits are the same.

7. The transaction splitting apparatus of claim 1, wherein the second processing unit shifts a (B plus W plus L)-th bit through a (W plus L plus 1)-th bit from an LSB to an (N plus B)-th bit through an (N plus 1)-th bit from the LSB, and shifts the (N plus B)-th bit through a (B plus W plus L plus 1)-th bit from the LSB to an N-th bit through the (W plus L plus 1)-th bit from the LSB, to translate the address of the at least one sub-transaction, when a number of the plurality of banks is $2^B$, when each of the plurality of banks has a size of $2^N$ bytes, when the at least one sub-transaction has a maximum burst length of $2^L$, and when a system has a data width of $2^W$ bytes, wherein B, N, L and W are natural numbers.

8. The transaction splitting apparatus of claim 7, wherein the transaction is transmitted from at least one module among an image signal processor, a video codec, and a three-dimensional (3D) graphic accelerator.

9. A transaction splitting method, comprising:
splitting, by a first processing unit of a transaction splitting apparatus having a hardware processor, a transaction into at least one sub-transaction, the transaction accessing a first bank among a plurality of banks comprised in a memory; and
translating, by a second processing unit of the transaction splitting apparatus having the processor, an address of the at least one sub-transaction to interleave the at least one sub-transaction by accessing different banks of the plurality of banks,
wherein the at least one sub-transaction accesses the different banks of the plurality of banks consecutively,
wherein commands that are associated with addresses of which a most significant bit (MSB) through an (L plus W plus 1)-th bit from a least significant bit (LSB) are the same are split into at least one sub-transaction, when the at least one sub-transaction has a maximum burst length of $2^L$, and when a system has a data width of $2^W$ bytes, wherein L and W are natural numbers.

10. The transaction splitting method of claim 9, wherein a first sub-transaction among the at least one sub-transaction is processed by accessing the first bank, and a second sub-transaction among the at least one sub-transaction is processed by a second bank among the plurality of banks.

11. The transaction splitting method of claim 9, wherein an active operation of the second bank for processing the second sub-transaction is performed while the first sub-transaction is processed by accessing the first bank.

12. The transaction splitting method of claim 9, further comprising:
buffering, by a third processing unit of the transaction splitting apparatus, the at least one sub-transaction for which the address is translated, when the transaction is a write transaction; and
outputting, by the third processing unit, a complete signal of the transaction, when the buffering is completed.

13. The transaction splitting method of claim 9, wherein commands that are scheduled to be exchanged in the transaction and are associated with addresses of which higher-order bits are the same are split into at least one sub-transaction.

14. The transaction splitting method of claim 9, wherein the translating comprises shifting a (B plus W plus L)-th bit through a (W plus L plus 1)-th bit from an LSB to an (N plus B)-th bit through an (N plus 1)-th bit from the LSB, and shifting the (N plus B)-th bit through a (B plus W plus L plus 1)-th bit from the LSB to an N-th bit through the (W plus L plus 1)-th bit from the LSB, when a number of the plurality of banks is $2^B$, when each of the plurality of banks has a size of $2^W$ bytes, when the at least one sub-transaction has a maximum burst length of $2^L$, and when a system has a data width of $2^W$ bytes, wherein B, N, L and W are natural numbers.

15. A non-transitory computer readable recording medium storing a program to cause a computer to implement the transaction splitting method of claim 9.

16. The transaction splitting apparatus of claim 1, wherein a command signal based on the translated address comprises a first active command preceding a first read/precharge command, corresponding to a first sub-transaction, sequentially followed by a second active command preceding a second read/precharge command, corresponding to a second sub-transaction.

17. The transaction splitting apparatus of claim 1, wherein a first section of the address, including the most significant bit (msb) through a (B plus N plus 1)-th bit, and a last section, including a (W plus L)-th bit through a least significant bit (LSB), are excluded during the address translation, when a number of the plurality of banks is $2^B$, when each of the plurality of banks has a size of $2^N$ bytes, when the at least one sub-transaction has a maximum burst length of $2^L$, and when a system has a data width of $2^W$ bytes, wherein B, N, L and W are natural numbers.

18. The transaction splitting apparatus of claim 1, wherein the transaction includes a plurality of transactions and the first processing unit splits the plurality of transactions into the at least one sub-transaction.

* * * * *

UNITED STATES PATENT AND TRADEMARK OFFICE
CERTIFICATE OF CORRECTION

| | | |
|---|---|---|
| PATENT NO. | : 9,104,526 B2 | Page 1 of 1 |
| APPLICATION NO. | : 13/067071 | |
| DATED | : August 11, 2015 | |
| INVENTOR(S) | : Young-Sun Jeon et al. | |

It is certified that error appears in the above-identified patent and that said Letters Patent is hereby corrected as shown below:

In the claims,

Claim 14, Column 12, Line 51

Delete "$2^W$" and insert --$2^N$--, therefor.

Signed and Sealed this
Twenty-fourth Day of November, 2015

Michelle K. Lee
*Director of the United States Patent and Trademark Office*